United States Patent
Hong

(10) Patent No.: US 7,883,950 B2
(45) Date of Patent: Feb. 8, 2011

(54) SEMICONDUCTOR DEVICE HAVING REDUCED POLYSILICON PATTERN WIDTH AND METHOD OF MANUFACTURING THE SAME

(75) Inventor: Ji Ho Hong, Hwaseong-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 581 days.

(21) Appl. No.: 11/875,005

(22) Filed: Oct. 19, 2007

(65) Prior Publication Data

US 2008/0122019 A1    May 29, 2008

(30) Foreign Application Priority Data

Nov. 29, 2006  (KR)  ............... 10-2006-0118810

(51) Int. Cl.
  *H01L 21/336*  (2006.01)
  *H01L 21/8234* (2006.01)
  *H01L 21/44*   (2006.01)
  *H01L 21/461*  (2006.01)

(52) U.S. Cl. ................ 438/197; 438/578; 438/739

(58) Field of Classification Search ................ 438/147, 438/197, 574, 578, 734, 739, 745, 749, E21.409, 438/E29.255
See application file for complete search history.

(56) References Cited

U.S. PATENT DOCUMENTS

| 6,306,715 | B1  | 10/2001 | Chan et al.         |
|-----------|-----|---------|---------------------|
| 6,806,154 | B1* | 10/2004 | Lo ............... 438/303 |
| 6,905,976 | B2* | 6/2005  | Beintner et al. ...... 438/752 |
| 7,214,988 | B2* | 5/2007  | Tsao et al. ......... 257/368 |
| 7,268,066 | B2* | 9/2007  | Bonser et al. ....... 438/585 |
| 2006/0017099 | A1* | 1/2006 | Paik ............... 257/330 |

* cited by examiner

*Primary Examiner*—Cuong Q Nguyen
(74) *Attorney, Agent, or Firm*—Saliwanchik, Lloyd & Saliwanchik

(57) ABSTRACT

Disclosed is a method of manufacturing a semiconductor device. The method comprises consecutively depositing and patterning polysilicon and mask material on a substrate to form a polysilicon layer and a mask layer, reducing a width of the polysilicon layer, depositing and etching insulating material on the substrate to form a spacer on a lateral side of the polysilicon layer, and forming a source/drain region in the substrate at sides of the spacer.

12 Claims, 4 Drawing Sheets

SEMICONDUCTOR DEVICE HAVING REDUCED POLYSILICON PATTERN WIDTH AND METHOD OF MANUFACTURING THE SAME

CROSS-REFERENCE TO RELATED APPLICATION

The present application claims the benefit under 35 U.S.C. §119 of Korean Patent Application No. 10-2006-0118810, filed Nov. 29, 2006, which is hereby incorporated by reference in its entirety.

BACKGROUND

The performance of a semiconductor device is greatly affected by the Critical Dimension (CD) of a gate. That is, as the CD of the gate is shortened, gate signals are transmitted well, so the desired functions of the device can be performed without errors. Further, as the CD of the gate is shortened, the size of the device is reduced, so the device can be highly integrated.

Accordingly, research has been actively studied to shorten the CD of the gate in the semiconductor device.

The CD of the gate can be determined depending on the efficiency of photolithography and etching processes.

Accordingly, in order to precisely form the CD of the gate, various attempts are introduced in the photolithography and etching processes.

For example, one attempt is to employ a photolithography process apparatus having an ArF light source (wavelength of 193 nm) instead of a photolithography process apparatus having a KrF light source (wavelength of 248 nm). However, since the photolithography process apparatus having the ArF light source is expensive, the process cost is increased.

In addition, the etching process requires the establishment of more advanced process conditions capable of satisfying the gate CD as well as small Line Edge Roughness (LER) characteristics for a profile after the etching process. However, such advanced process conditions have not yet been established.

BRIEF SUMMARY

Embodiments of the present invention provide a semiconductor device and a method of manufacturing the same capable of reducing the process cost when using a related process apparatus.

An embodiment of the present invention provides a semiconductor device and a method of manufacturing the same capable of improving performance by reducing a gate CD.

In an embodiment, there is provided a method of manufacturing a semiconductor device, comprising: sequentially depositing and patterning polysilicon and mask material on a substrate to form a polysilicon layer pattern and a mask layer pattern; performing an etching process with respect to the mask layer pattern and the polysilicon layer pattern to reduce a width of the polysilicon layer pattern; depositing and patterning insulating material on the substrate to form a spacer on a lateral side of the polysilicon layer pattern; and forming a source/drain region in the substrate at sides of the spacer.

In one embodiment there is provided a semiconductor device comprising: a polysilicon layer pattern on a substrate, in which a width of the polysilicon layer pattern reduces from a top region to an intermediate portion thereof; a spacer on a lateral side of the polysilicon layer pattern; and a source/drain region in the substrate at sides of the spacer.

DETAILED DESCRIPTION

Hereinafter, an embodiment of the present invention will be described with reference to the accompanying drawings. When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
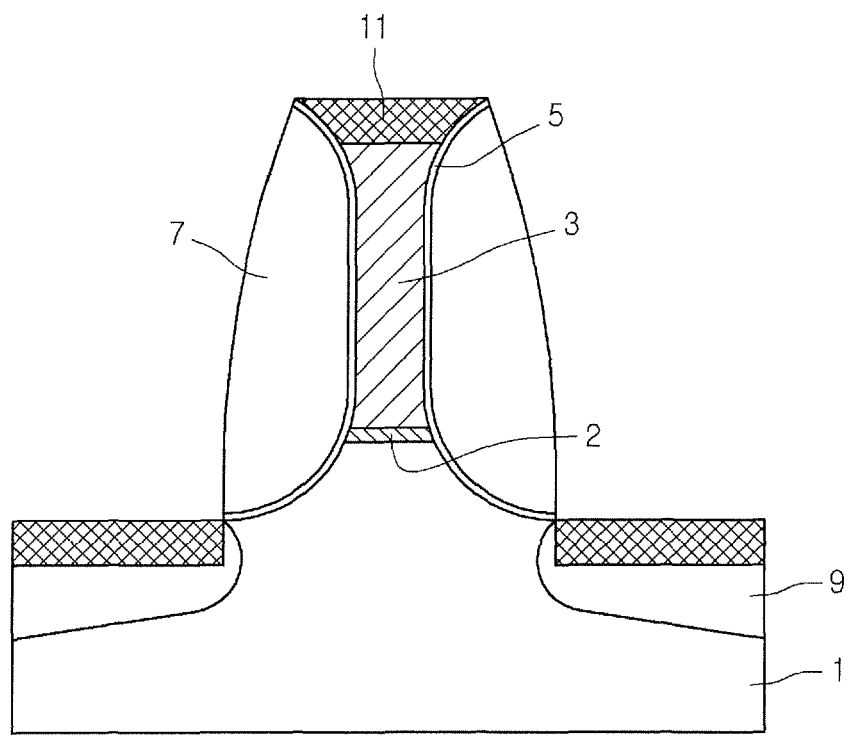
FIG. 1 is a cross-sectional view of a semiconductor device according to an embodiment of the present invention.

Referring to FIG. 1, a transistor having a gate with a reduced critical dimension (CD) can be provided. The transistor can include a gate oxide layer 2 and a polysilicon layer 3 on a substrate 1.

The polysilicon layer 3 can be formed such that the width of the upper portion thereof is wider than the width of an intermediate portion thereof. In an embodiment, the polysilicon layer 3 can have lateral sides that are rounded from the upper side thereof to the lower side thereof.

The width of the polysilicon layer 3 can have a reducing width from the top surface thereof to an intermediate portion thereof and then can have a constant width in the intermediate portion. The intermediate portion can start at a location corresponding to ⅓ to ¼ of the height of the polysilicon layer 3 from the top surface of the polysilicon layer 3.

An oxide layer 5 can be formed on the lateral sides of the polysilicon layer 3. The oxide layer 5 can be used to stabilize the polysilicon layer 3 and can simultaneously inhibit gate signals provided to the polysilicon layer 3 from being leaked.

A spacer 7 can be formed on the lateral sides of the oxide layer 5.

The spacer 7 may include a single layer containing $SiO_2$, or a multi-layer containing $SiO_2$—$Si_3N_4$—$SiO_2$ (ONO) or $SiO_2$—$Si_3N_4$ (ON).

The spacer 7 can support the polysilicon layer 3 and can also be used to inhibit the gate signals provided to the polysilicon layer 3 from being leaked.

A source/drain region 9 can be formed in the substrate 1 at sides of the spacer 7.

A silicide layer 11 can be formed on the source/drain region 9 and the polysilicon layer 3 to reduce contact resistance with a line. In one embodiment, the silicide layer 11 includes $CoSi_2$.

The source/drain region 9 and the polysilicon layer 3 can be electrically connected to a line that receives signals from the exterior. In such a case, contact resistance exists among the line and the source/drain region 9 and the polysilicon layer 3. The contact resistance is a very important factor because the transfer capability of signals provided from the exterior is determined by the contact resistance. In this regard, in order to reduce the contact resistance, the silicide layer 11 can be provided on the source/drain region 9 and the polysilicon layer 3.

According to the embodiment described above, the CD of the gate including the polysilicon layer 3 and the gate oxide layer 2 is reduced, thereby improving the performance of the device.

Further, according to an embodiment, the gate CD can be reduced using a related photolithography apparatus, thereby reducing the process cost and improving the performance of the device.

Consequently, a semiconductor device having a smaller size can be manufactured using the related photolithography apparatus.

FIGS. 2A to 2F are cross-sectional views showing a procedure of manufacturing the semiconductor device according to an embodiment.

Figure 2A:
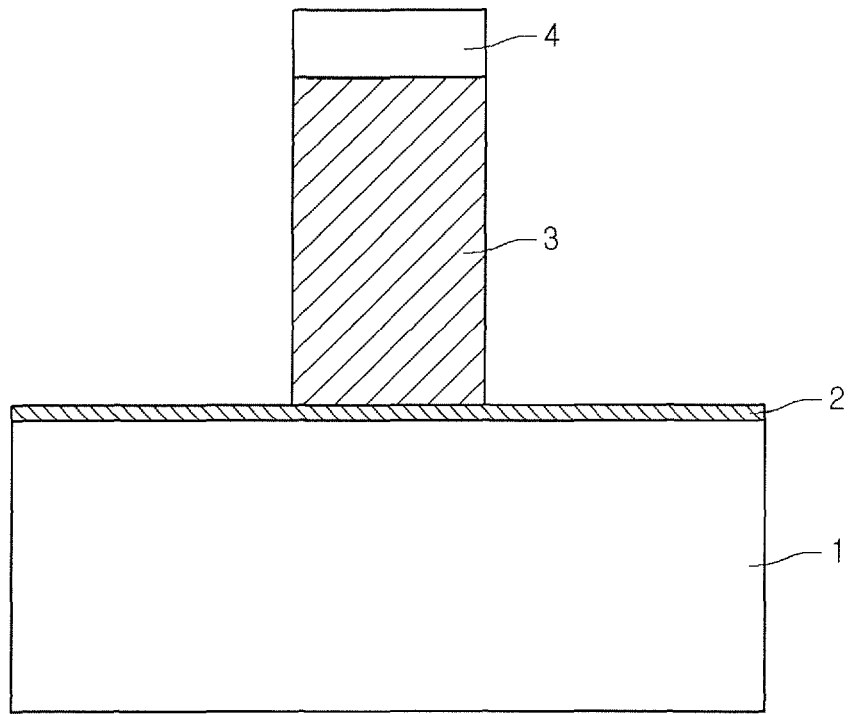
FIGS. 2A to 2F are cross-sectional views illustrating a method of manufacturing a semiconductor device according to an embodiment of the present invention.

Referring to FIG. 2A, the surface of the substrate 1 can be thermal-oxidized to form a gate oxide layer 2. Before forming the gate oxide layer 2, an isolation region (not shown) that isolates a device region can be formed on the substrate 1 through, for example, an STI (shallow trench isolation) process.

Then, polysilicon and a mask material can be consecutively deposited on the gate oxide layer 2, and a photoresist pattern can be formed on the mask material using a photolithography process. In one embodiment, the mask material is $SiO_2$.

Next, the mask material and the polysilicon material can be patterned through a dry etching process using the photoresist pattern as a mask to form a polysilicon layer pattern 3 and a mask layer pattern 4 on the substrate 1. The dry etching process can be performed using, for example, Reactive Ion Etching (RIE).

Figure 2B:
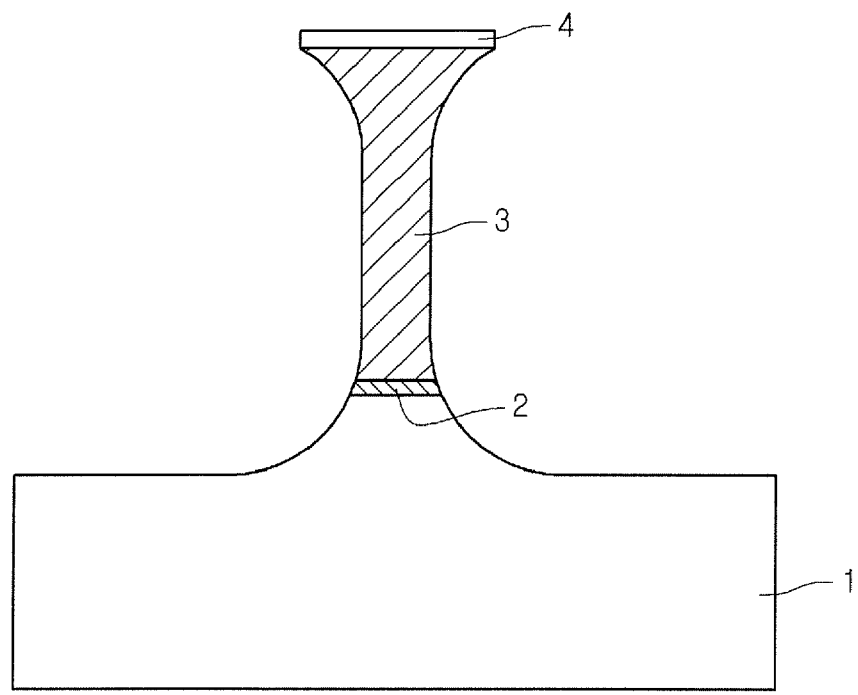

Referring to FIG. 2B, a wet etching process can be performed using the mask layer pattern 4 as an etching mask.

During the wet etching process, etchant solution preferably reacts with the polysilicon layer pattern 3 at a high speed and reacts with the mask layer pattern 4 at a low speed. That is, the etchant solution may have selectivity of 1:7 to 1:3 with respect to the polysilicon layer pattern 3 and the mask layer pattern 4. Through the wet etching process, the surface of the mask layer pattern 4 may be slowly removed, but the side of the polysilicon layer pattern 3 is quickly removed.

As a result, the thickness of the mask layer pattern 4 may be reduced, but is not completely removed. Further, the side of the polysilicon layer pattern 3 can be quickly removed, so that the side of the polysilicon layer pattern 3 can have a rounded shape. That is, the polysilicon layer pattern 3 is etched such that the width of the upper portion thereof is wider than that of the intermediate portion thereof.

The width of the polysilicon layer pattern 3 can be reduced from the top surface thereof to the intermediate portion thereof and then is constantly formed in the intermediate portion. The intermediate portion can start from a location corresponding to $1/3$ to $1/4$ of the height of the polysilicon layer pattern 3 when measured from the top surface of the polysilicon layer pattern 3.

Through the wet etching process, the gate oxide can be completely removed except for the gate oxide layer 2 below the polysilicon layer pattern 3. According to an embodiment, the substrate 1 formed under the removed gate oxide layer 2 may also be partially removed.

According to one embodiment, the mask material is formed of $SiO_2$. However, any suitable material can be used if the material has etching selectivity with the polysilicon layer pattern 3 that satisfies the conditions as described above.

Figure 2C:
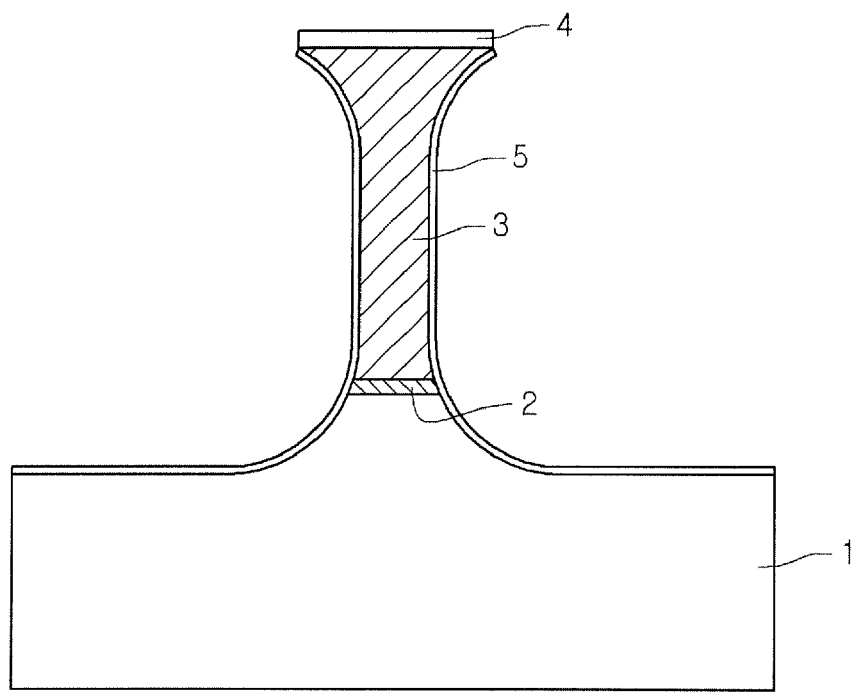

Referring to FIG. 2C, the substrate 1 can be thermal-oxidized to form an oxide layer 5 on the lateral sides of the polysilicon layer pattern 3 and the upper surface of the substrate 1. The oxide layer 5 can be formed to stabilize the polysilicon layer pattern 3 and inhibit the leakage of signals.

Figure 2D:
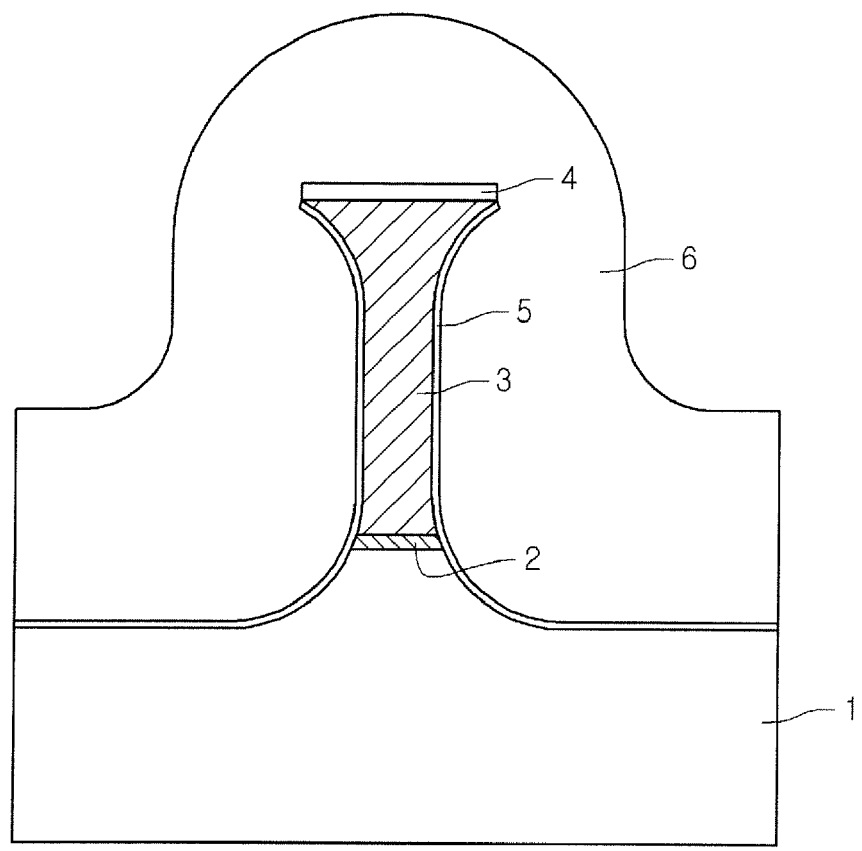

Referring to FIG. 2D, insulating material 6 can be deposited on the substrate 1. The insulating material 6 is preferably deposited thickly.

The insulating material 6 can be, for example, a single layer of $SiO_2$ or a multi-layer of $SiO_2$—$Si_3N_4$—$SiO_2$ (ONO) or $SiO_2$—$Si_3N_4$ (ON).

Figure 2E:
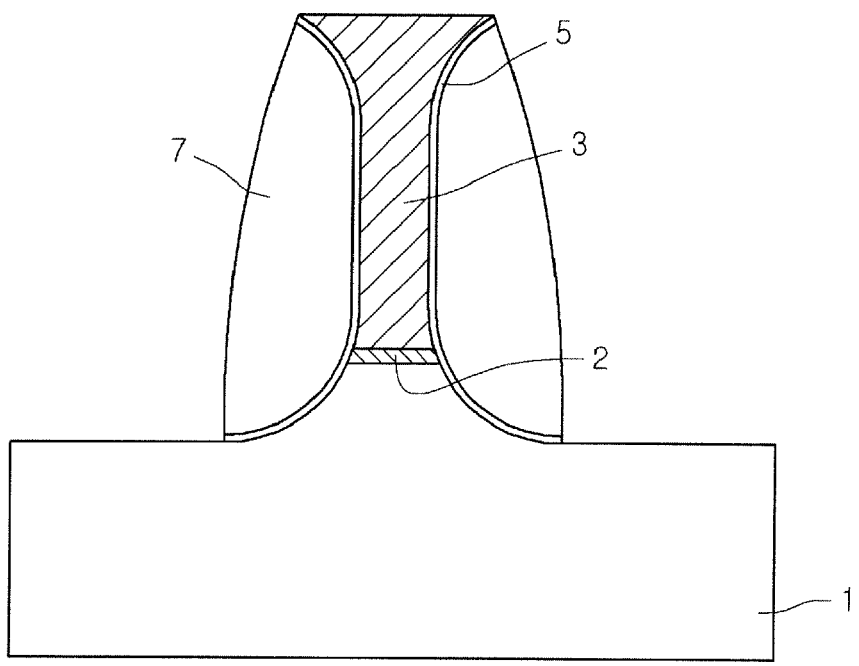

Referring to FIG. 2E, an etching process can be performed for the insulating material 6 until the remaining mask layer pattern 4 formed on the polysilicon layer pattern 3 is removed and spacers 7 are formed on lateral sides of the polysilicon layer pattern 3. Accordingly, in one embodiment an $SiO_2$ layer pattern 4 formed on the polysilicon layer pattern 3 is removed, and a spacer 7 is formed on the lateral sides of the polysilicon layer pattern 3. According to embodiments, the insulating material 6, the mask layer pattern 4, and the oxide layer 5 can be removed from the substrate 1 except for the spacer 7.

Figure 2F:
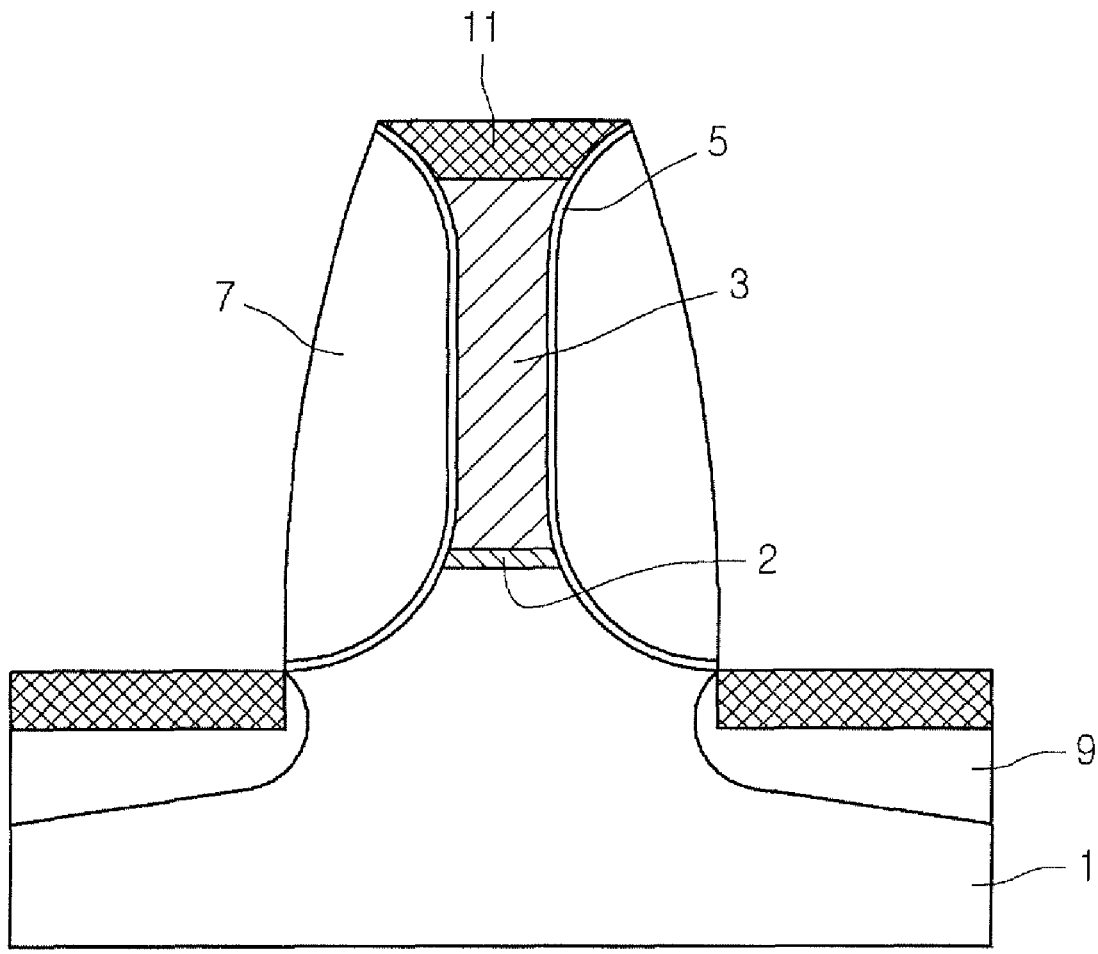

Referring to FIG. 2F, an ion implantation process implanting impurities onto the substrate 1 can be performed using the polysilicon layer pattern 3 and the spacer 7 as a mask. Accordingly, a source/drain region 9 can be formed in the substrate 1 at sides of the spacer 7.

Then, metal material having a very low resistivity can be deposited on the substrate 1, and heat can be applied to the metal material to form a silicide layer 11 through reaction of the metal material and the substrate 1. Unreacted metal material can be removed from the substrate. Accordingly, the silicide layer 11 can be formed only on the source/drain region 9 and the polysilicon layer 3. In one embodiment, the metal material includes cobalt and the silicide layer 11 includes $CoSi_2$.

The silicide layer 11 is electrically connected to a line formed through a subsequent process. In such a case, since the silicide layer 11 has a very low contact resistance, signals provided to the line can be precisely and easily transmitted to the source/drain region 9 and the polysilicon layer 3, so that the performance of the device can be improved.

According to embodiments of the present invention, the polysilicon layer pattern has a narrower width by introducing an etching step in the process technique, so that the gate CD can be minimized, thereby improving the performance of the device.

As described above, according to an embodiment, since the width of the polysilicon can be reduced using a related photolithography apparatus, the size of the device can be minimized. Simultaneously, since an expensive photolithography apparatus is not required to be used, process cost can be saved.

Further, according to an embodiment, the width of the polysilicon is reduced, so that the size of the device can be minimized and simultaneously the performance of the device can be considerably improved as compared with the related art.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art of effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a semiconductor device, comprising:
    sequentially depositing polysilicon and mask material on a substrate;
    patterning the deposited polysilicon and mask material to form a polysilicon layer pattern and a mask layer pattern;
    performing an etching process to reduce a width of the polysilicon layer;
    forming an oxide layer on lateral sides of the polysilicon layer pattern;
    depositing insulating material on the substrate including the mask layer pattern;
    etching the insulating material to form spacers on the lateral sides of the polysilicon layer pattern, wherein etching the insulating material removes a top surface portion of the substrate; and
    forming a source/drain region in the substrate at sides of the spacers.

2. The method according to claim 1, wherein the mask material comprises $SiO_2$.

3. The method according to claim 1, wherein performing the etching process to reduce the width of the polysilicon layer pattern reduces a thickness of the mask layer pattern.

4. The method according to claim 1, wherein performing the etching process to reduce the width of the polysilicon layer pattern comprises performing a wet etching process.

5. The method according to claim 4, wherein the wet etching process uses etchant solution having selectivity between 1:7 and 1:3 with respect to the polysilicon layer pattern and the mask layer pattern.

6. The method according to claim 1, wherein the polysilicon layer pattern is etched such that a width of an upper portion thereof is wider than that of an intermediate portion thereof.

7. The method according to claim 1, wherein the width of the polysilicon layer pattern reduces from a top surface thereof to an intermediate portion thereof and then is constant in the intermediate portion.

8. The method according to claim 7, wherein the intermediate portion starts at a location corresponding to ⅓ to ¼ of height of the polysilicon layer pattern from the top surface of the polysilicon layer pattern.

9. The method according to claim 1, further comprising forming a silicide layer on the source/drain region and the polysilicon layer pattern.

10. The method according to claim 1, wherein etching the insulating layer removes the mask layer pattern from the top surface of the polysilicon layer pattern.

11. The method according to claim 1, wherein the insulating material comprises a single layer consisting of $SiO_2$.

12. The method according to claim 1, wherein the insulating material comprises a multi-layer of one selected from the group consisting of $SiO_2$—$Si_3N_4$ (ON) and $SiO_2$—$Si_3N_4$—$SiO_2$ (ONO).

* * * * *